(12) United States Patent
Parekh et al.

(10) Patent No.: US 6,383,868 B1
(45) Date of Patent: May 7, 2002

(54) METHODS FOR FORMING CONTACT AND CONTAINER STRUCTURES, AND INTEGRATED CIRCUIT DEVICES THEREFROM

(75) Inventors: Kunal R. Parekh; John K. Zahurak, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/653,501

(22) Filed: Aug. 31, 2000

(51) Int. Cl.[7] .......................................... H01L 21/8242
(52) U.S. Cl. ..................... 438/253; 438/255; 438/618
(58) Field of Search ........................ 438/238, 253–256, 438/381, 396–399, 618–621

(56) References Cited

U.S. PATENT DOCUMENTS 6,025,226 A * 2/2000 Gambino et al. ........... 438/244
6,258,649 B1 * 7/2001 Nakamura et al. .......... 438/238

* cited by examiner

Primary Examiner—Jey Tsai
(74) Attorney, Agent, or Firm—Wells St. John P.S.

(57) ABSTRACT

Methods for forming contact structures and container structures, as well as integrated circuits that can be formed by employing those methods are provided. The integrated circuitry formed by the methods of the present invention provide capacitors in containers having sufficiently high storage capacitance for advanced integrated circuit devices. In addition the methods for forming such container capacitors facilitate the formation of contacts structures and provided for the formation of local interconnect structures and electrical contact to each of the structures formed.

31 Claims, 7 Drawing Sheets

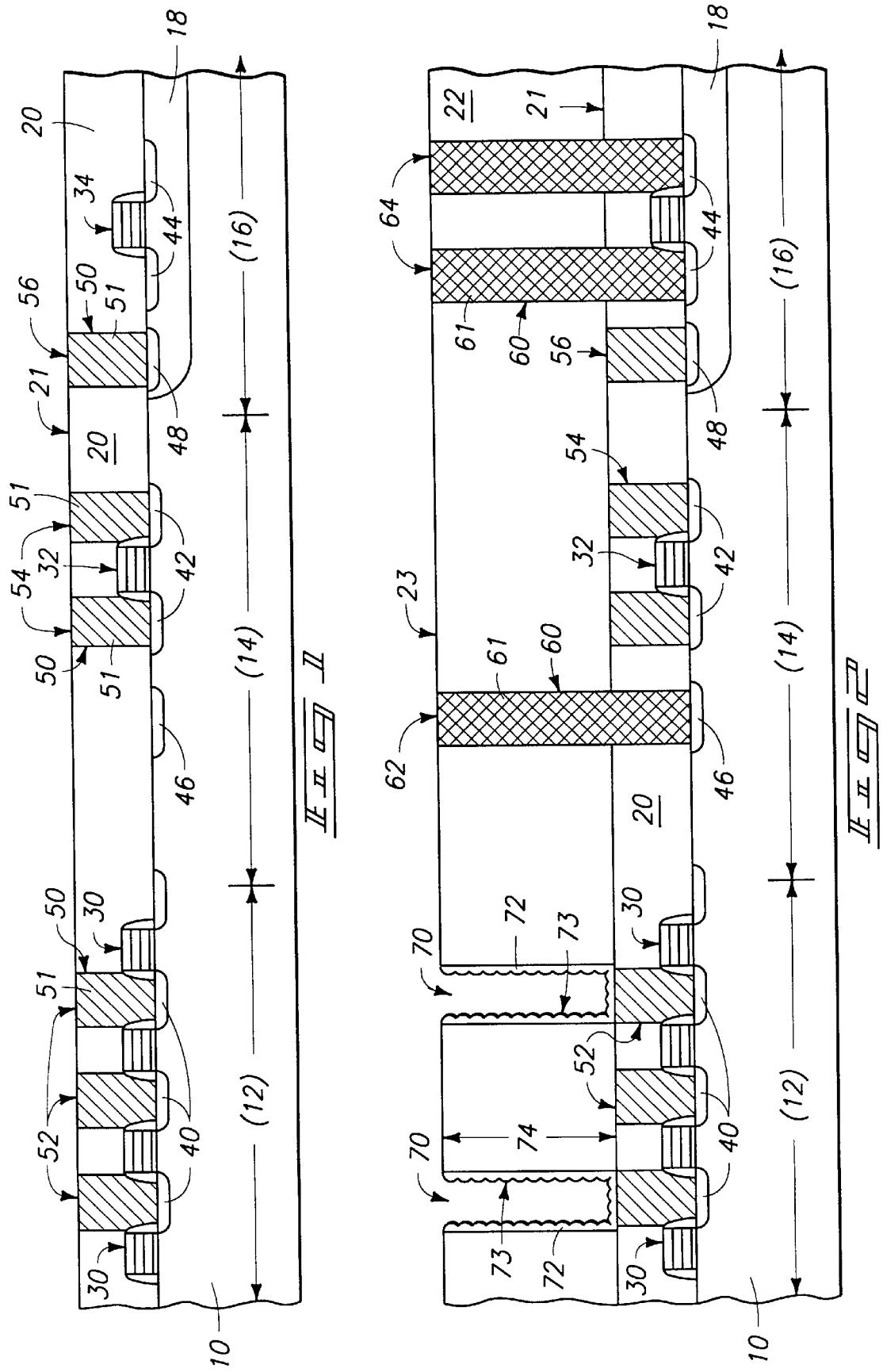

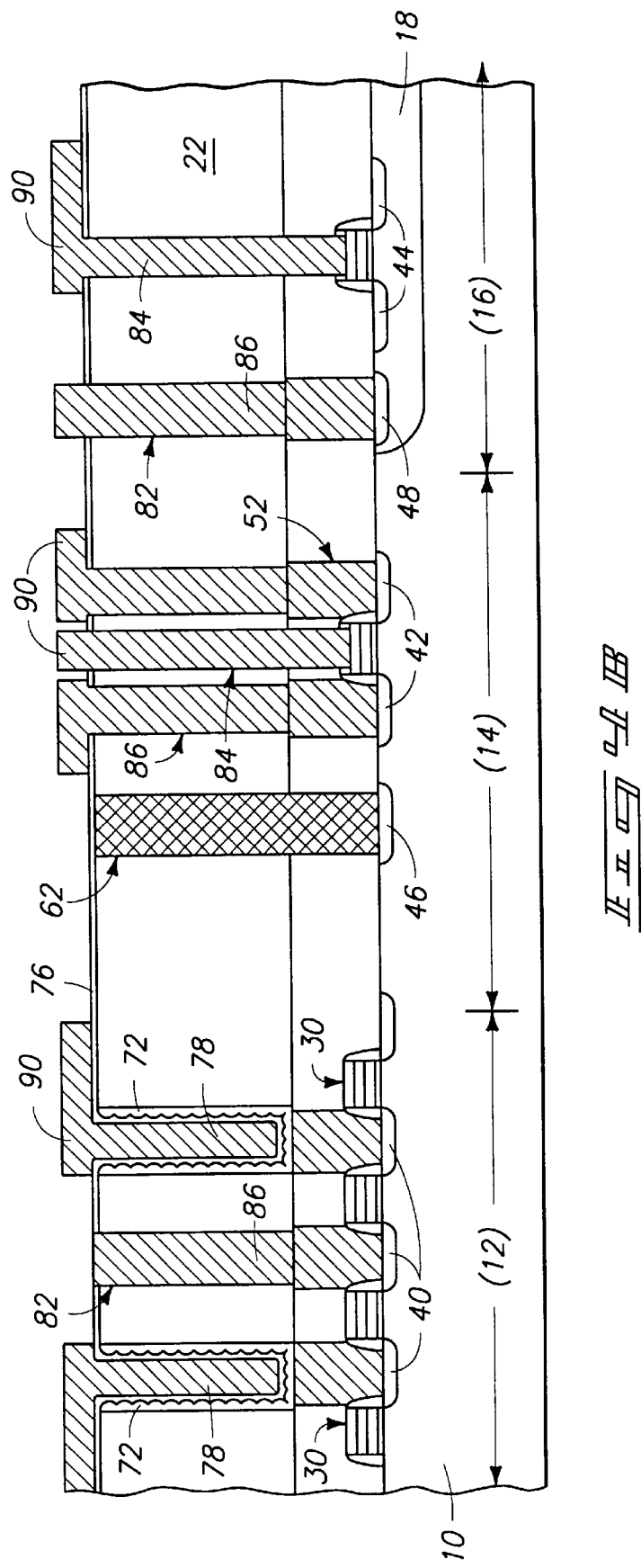

METHODS FOR FORMING CONTACT AND CONTAINER STRUCTURES, AND INTEGRATED CIRCUIT DEVICES THEREFROM

TECHNICAL FIELD

This invention relates generally to methods of forming contact structures and container structures and more specifically to a process of forming a container using a simplified contact formation method which advantageously simultaneously provides local interconnect contacts.

BACKGROUND OF THE INVENTION

As semiconductor devices get smaller in size, designers are faced with problems associated with the production of capacitors which consume a small enough amount of surface area to meet design criteria, yet maintain sufficient capacitance in spite of this smaller size.

One type of capacitor that has proven successful in this regard is the container capacitor which is so named for its container-like appearance. Heretofore designers of semiconductor devices, and in particular container capacitors, have focused their attention on increasing the surface area of the inner capacitor plate to increase capacitance. Depositing polysilicon which has a rough surface texture on the inside of the containers, for example, hemispherical grain polysilicon (HSG), increases the surface area of the inner capacitor plate, and translates into the desired increased capacitance.

While the use of the technique, such as described above, initially proved successful, more recently as the lateral dimension of containers has become smaller in size, the use of materials such as HSG polysilicon becomes less attractive because the rough outer surface of such materials facilitates plugging or otherwise occluding the smaller contact openings of such containers. Accordingly, it becomes necessary to reduce the grain size or roughness of the HSG which, in turn, reduces the area enhancement factor of the film.

One type of integrated circuitry which utilizes capacitors is memory, such as dynamic random access memory (DRAM) circuitry. As DRAMs increase in memory cell density, it becomes an increasingly difficult challenge to maintain sufficiently high storage capacitance despite the decreasing cell lateral dimension necessary to achieve the higher cell density. Additionally, there is a continuing goal to further decrease cell area. One possible method of increasing cell storage capacitance is by increasing the height of the container. In this manner, a higher storage capacitance is possible without increasing the surface area such a container consumes. However, increasing the height of the container also increases the height/aspect ratio of the various contacts that must be made. Previously known methods for forming such high height/aspect ratio contacts are generally unsatisfactory, making their use problematic.

Therefore it would be advantageous to provide integrated circuitry device capacitors in containers having sufficiently high storage capacitance for advanced devices, despite decreasing device dimensions. It would also be advantageous to provide memory circuitry, and in particular DRAM circuitry, with capacitors in containers having sufficiently high storage capacitance despite decreasing cell area. In addition it would be advantageous if the methods for forming such container capacitors facilitated formation of contacts and provided for enhanced local interconnect contact formation.

SUMMARY

Methods for forming contact structures and container structures, as well as integrated circuits that can be formed by employing those methods are provided. Some embodiments of such methods, in accordance with the present invention, encompass providing a semiconductor substrate with a first insulative layer formed over the substrate and a second insulative layer formed over the first insulative layer. Formed within the first insulative layer are a plurality of first contact structures having a first conductivity type.

In some embodiments of the present invention, after forming the second insulative layer, second contact structures are formed within both the second insulative layer and the first insulative layer. In addition, at least one container structure, overlying at least one of the plurality of first contact structures, is formed within the second insulative layer. Some embodiments of the present invention form the second contact structures and the at least one container structure separately, such separate formation including separately forming conductive material that is disposed within each structure. The separate forming of conductive material provides for forming capacitor structures within the containers structures and a distinctive contact plug material within the contact structures. In some embodiments at least one of the second contact structures electrically contacts a conductive region within a P-peripheral region of the substrate and the capacitor structure electrically contacts at least one of the first contact structures. The first contact structures having been previously formed in electrical contact with conductive regions within a memory array region of the substrate.

In some embodiments a plurality of third contact holes and at least one fourth contact hole are formed and subsequently concurrently filled with a conductive material. In some embodiments, such fourth hole extends into the first insulative layer to expose a portion of a gate structure within an N-peripheral region. In some embodiments in accordance with the present invention, the filling of the third and fourth contact holes with a conductive plate material forms a layer of such conductive material overlying the second insulative layer, this layer of conductive material then being transformable into local interconnect structures.

Embodiments in accordance with the present invention generally include a third insulative layer formed overlying the second insulative layer and, where formed, the local interconnect structures. The third layer of insulative material encompasses a plurality of fifth and sixth contact holes formed therein. Such fifth and sixth contact holes for making electrical contact to the third and fourth contact structures as well as to the local interconnect structures. The fifth and sixth contact holes are generally filled with a conductive material such as a tungsten material or a combination of a barrier material such as titanium nitride and a tungsten material.

Embodiments of the present invention include any and all of the structures described herein below, as well as integrated circuit devices that are within the scope and spirit of the teachings herein, such devices formed by employing the methods and structures of embodiments of the present invention as well as modifications of such methods and structures made possible by the teachings herein.

BRIEF DESCRIPTION OF THE DRAWINGS

Preferred embodiments of the invention are described below with reference to the following accompanying drawings. For ease of understanding and simplicity, common numbering of elements within the drawings is employed where the element is the same between drawings.

FIGS. 1–2 are cross-sectional views of a portion of an integrated circuit in accordance with embodiments of the present invention.

DETAILED DESCRIPTION

Figure 3:
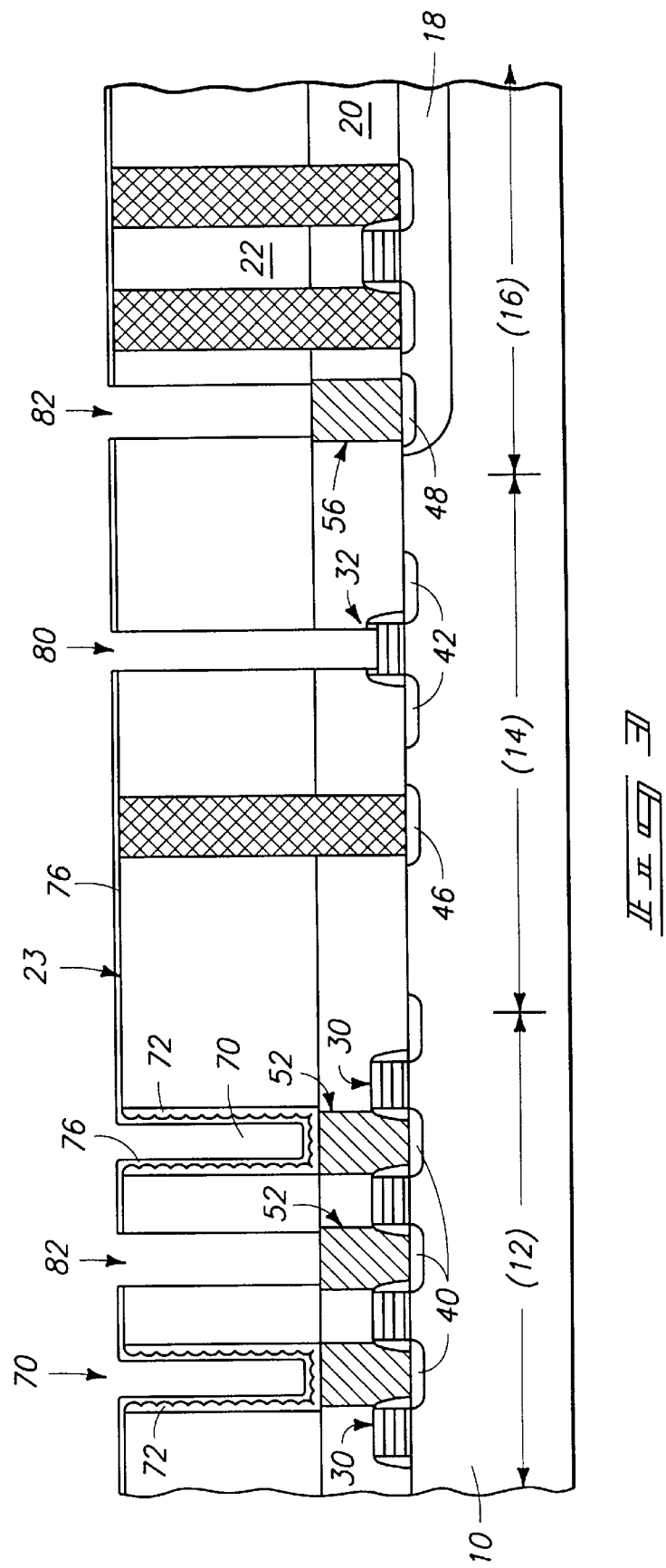
FIG. 3 is a cross-sectional view of another portion of an integrated circuit in accordance with embodiments of the present invention.

This disclosure of the invention is submitted in furtherance of the constitutional purposes of the U.S. Patent Laws "to promote the progress of science and useful arts" (Article 1, Section 8).

Embodiments of the present invention will be described with reference to the aforementioned figures. Various modifications or adaptations of specific methods and or structures may become apparent to those skilled in the art as embodiments of the present invention are described. All such modifications, adaptations or variations that rely upon the teachings of the present invention, and through which these teachings have advanced the art, are considered to be within the spirit and scope of the present invention.

To aid in interpretation of the description of the illustrations and claims that follow, the term "semiconductor substrate" is defined to mean any construction comprising semiconductive material, including, but not limited to, bulk semiconductive materials such as a semiconductor wafer (either alone or in assemblies comprising other materials thereon) and semiconductive material layers (either alone or in assemblies comprising other materials). The term "substrate" refers to any supporting structure, including, but not limited to, the semiconductor substrates described above. In addition, as the structures formed by embodiments in accordance with the present invention are described hereinbelow, common semiconductor terminology such as N-type, P-type, N+ and P+ will be employed to describe the type of conductivity doping used for the various structures or regions being described. The specific levels of doping are not believed to be germane to embodiments of the present invention; thus, it will be understood that while specific dopant species and concentrations are not mentioned, an appropriate dopant species with an appropriate concentration to its purpose, is employed. Finally, it will be understood that the number, relative size and spacing of the structures depicted in the accompanying figures are exemplary only, and thus were selected for ease of explanation and understanding. Therefore such representations are not indicative of the actual number or relative size and spacing of an operative embodiment in accordance with the present invention.

Referring to FIG. 1, a cross-sectional view of a portion of a semiconductor substrate 10 is depicted having a memory array region 12, an N-peripheral region 14 and a P-peripheral region 16. Regions 12, 14 and 16 encompass sections of a dynamic random access memory (DRAM) device. As depicted, substrate 10 is a P-type semiconductor substrate; thus P-peripheral region encompasses N-well 18. In array portion 12, a plurality of transistor gate structures 30 are shown over substrate 10 with source/drain regions 40 formed within substrate 10 and operationally adjacent to such gate structures 30. Gate structures 30 are representative of word lines.

In N-peripheral portion 14 and P-peripheral portion 16, a single transistor gate structure 32 and 34, respectively, is depicted formed over substrate 10. Each gate 32 and 34, has appropriately formed source/drain regions 42 and 44, respectively, formed operationally adjacent thereto. N-peripheral region 14 also encompasses a P+ contact enhancement region 46 proximate gate 32. Similarly, P-peripheral region 16 encompasses an N+ contact enhancement region 48 formed within N-well 18 and proximate gate structure 34.

Figure 6:
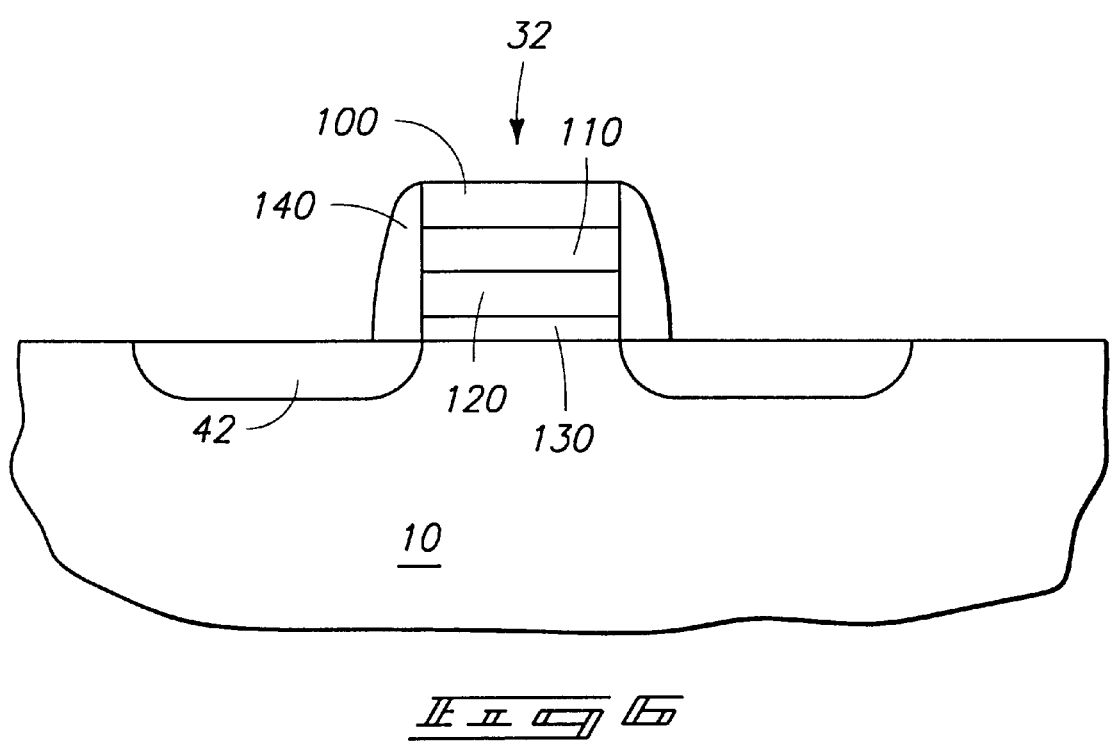
FIG. 6 is an enlarged cross-sectional view of a transistor gate structure having a contact structure formed thereto in accordance with embodiments of the present invention.

Referring briefly to FIG. 6, an enlarged cross-sectional view of a transistor gate structure 32 is depicted. As shown, gate structure 32 is formed over substrate 10 having an upper insulative layer 100, a silicide layer 110, a gate electrode layer 120 and a gate dielectric layer 130. Also shown are insulative sidewall spacers 140 disposed laterally adjacent each of such layers and overlying substrate 10. In addition, portions of source/drain regions 42 are depicted operationally adjacent gate structure 32 and disposed with substrate 10. Upper insulative layer 100 is generally formed of a silicon oxide material, a silicon nitride material or a material encompassing a mixture thereof. Silicide layer 110 is generally a refractory metal silicide material such as titanium silicide, tungsten silicide, cobalt silicide, a combination of tungsten/tungsten nitride or any other appropriate material where such material of layer 110 is formed employing appropriate forming methods for the material selected. Gate electrode layer 120 is typically a doped polysilicon material again formed by conventional methods and gate dielectric layer 130 is generally a silicon oxide material formed by a oxidative process. Finally, sidewall spacers 140 are formed of an insulative material such as a silicon oxide material using conventional sidewall spacer forming methodology.

Returning to FIG. 1, overlying substrate 10 is a first insulative layer 20 having memory array contact structures 52, N-peripheral source/drain contact structures 54 and P-peripheral N+ contact enhancement contact structure 56 formed therein. Layer 20 is generally formed from borophosphosilicate glass (BPSG), although other appropriate materials can be used. Each of contact structures 52, 54 and 56 encompass a first contact hole 50 and a first contact plug 51. First contact holes 50, for each of first contact structures 52, 54 and 56, are formed by photolithographically patterning a masking layer (not shown), disposed over layer 20. Such a patterned masking layer exposes appropriate portions of layer 20 so that the exposed portions can be etched into and through layer 20 to expose portions of source/drain regions 40 and 42 as well as N+ contact enhancement region 48. Such etching forms contact holes 50. The patterning and etching of BPSG layer 20 is accomplished by any of the known photolithographic/etch processes employed for such purposes. Additionally, some embodiments of the present invention incorporate an optional thin barrier layer (not shown), such as undoped silicon oxide or silicon nitride, can be provided over the substrate prior to deposition of layer 20 to serve as a shield to undesired boron or phosphorus diffusion from BPSG layer into substrate 10, where such an optional barrier layer is employed, etch contact holes 50 includes etching such a barrier layer to expose the aforementioned regions.

Still referring to FIG. 1, once first contact holes 50 are formed, the masking layer is removed and a conductive material is formed over BPSG layer 20 such that holes 50 are filled with such material. While not shown, the forming of the conductive material is not generally selective to holes 50 and thus overlies an upper surface (not shown) of initially formed layer 20. Subsequent to forming the conductive material overlying layer 20, a planarization process is employed to form a planarized surface 21. Advantageously, in forming planarized surface 21 conductive material overlying such surface is removed and first contact plugs 51 defined for each of contact structures 52, 54 and 56. Generally a chemical mechanical polishing (CMP) planarization process is employed to form planarized surface 21 and define plugs 51, although any other appropriate planarization process can also be employed. Contact plugs 51 typically are formed of an in situ doped, N-type polysilicon material using a low pressure chemical vapor deposition (CVD) process, however another appropriate material or process can be employed, if desired.

It will be understood that in forming first contact structures 52, 54 and 56 in the manner described above, BPSG layer 20 is thinned from an initially formed thickness. Therefore, it is found advantageous to form first insulative layer 20 with the initially formed thickness between approximately 700 nanometers (nm) to 1400 nm such that after planarization and forming of contact structures 52, 54 and 56, BPSG layer 20 of between approximately 400 nm to 800 nm and typically 700–800 is obtained, however other appropriate thickness may also be used. It will be noted that for embodiments in accordance with the present invention, first insulative layer 20, as well as other such insulative layers to be discussed below, are formed by any of the known CVD processes generally employed for forming such layers. For example, where layer 20 is formed of BPSG, a low pressure CVD process employing SiH4, N2O, B2H6 and PH3 is appropriate.

Turning now to FIG. 2, the structure of FIG. 1 is depicted after subsequent processing in accordance with embodiments of the present invention. As shown, a second insulative layer 22 is formed overlying planarized upper surface 21 of first layer 20. While layer 22 is generally formed of BPSG, as discussed for layer 20, it will again be understood that other appropriate materials can also be used. In addition, optionally, an etch stop layer (not shown) can be formed outwardly of first layer 20 prior to forming layer 22. Where such an optional etch stop layer is formed, such layer will encompass a material relative to which, layer 22 can be substantially selectively etched. Exemplary materials for such an etch stop layer include BN, Si3N4, and undoped silicon oxide.

Second contact structures 62 and 64 are shown formed into and through BPSG layers 22 and 20, and overlying a portion of P+ contact enhancement region 46 and portions of source/drain regions 44, respectively. In a manner analogous to first contact structures 52, 54 and 56 second contact structures 62 and 64 each encompass a second contact hole 60 and a second contact plug 61. Thus, contact holes 60 are formed by disposing a masking layer (not shown) over initially formed layer 22 and photolithographically patterning such masking layer to expose appropriate portions of an initial upper surface (not shown). Such exposed portions are then etched through layers 22 and 20 to expose a portion of P+ contact enhancement region 46 and portions of source/drain regions 44. While the patterning and etching of BPSG layers 22 and 20 is accomplished by the use of well known photolithographic and etch processes, it will be noted that contact holes 61 are advantageously formed separately from any other structure. In this manner, the photolithographic and etch process employed can be tailored to ensure that each contact hole 60 is well formed and dimensioned. For example, where an etch stop layer is disposed between layers 20 and 22, etching contact hole 60 separately allows for etching through such etch stop layer without effecting the etching of any other structure. Thus, both the yield and reliability of the subsequently formed electrical contact to enhancement region 46 and source/drain regions 44 are enhanced in comparison to previously known methods and devices formed therefrom.

Once contact holes 60 are formed, a conductive material is formed over BPSG layer 22 such that second holes 60 are filled. While not shown, the forming of the conductive material is not generally selective to holes 60 and thus generally overlies an upper surface (not shown) of initially formed layer 22. Therefore, after forming the conductive material, a planarization process is employed to form a planarized upper surface of layer 22 (not shown), where conductive material overlying such surface is removed and contact plugs 61 are initially defined in a manner analogous to the forming of contact plugs 51, as previously described. The planarization process employed is typically a CMP process, although another appropriate planarization process can also be used. Second contact plugs 61 are typically formed of an in situ doped P-type polysilicon material using a low pressure CVD process, as is generally known, however other materials such as CVD formed titanium nitride can also be selected for plugs 61. It will be noted that as contact holes 60 were separately formed, contact plugs 61 are also separately formed. Thus the CVD, or other process employed, can advantageously be tailored specifically to filling second contact holes 60 for forming second contact plugs 61, thus enhancing both the yield and reliability of electrical contact to P+ enhancement region 46 and source/drain regions 44.

Still referring to FIG. 2, once second contact plugs 61 are initially formed, a second masking layer (not shown) is applied over BPSG layer 22 to mask plugs 61 and expose one or more portions of the initially planarized surface of layer 22 (not shown) within array region 12, for the formation of capacitor containers 70. Containers 70 are formed by etching into and through BPSG layer 22 to expose at least a portion of selected underlying array contact structures 52. Where the optional etch stop layer is disposed between layers 20 and 22, generally the etching of containers 70 utilizes such layer for accurately ending the container etching at the level of contact structures 52, although it will be understood that such layer is appropriately removed by the etching to provide for subsequent electrical contact to the contact structure 52 depicted. It will be noted that while FIG. 2 depicts a single container 70 overlying a single contact structure 52, such is exemplary of only some embodiments in accordance with the present invention. Thus some embodiments of the present invention provide containers 70 that overlie more than one contact structure 52.

After capacitor containers 70 are formed, the second masking layer is removed and a roughened or rugged capacitor structure 72 is formed. Such structure 72 is in electrical contact with memory array contact structure 52. The materials of capacitor structure 72 generally encompasses a conductive layer, and a dielectric layer formed overlying such conductive layer (not shown). In this manner such dielectric layer has an outer surface that is inwardly facing within container 70, such outer surface being depicted as outer surface 73 of rugged capacitor structure 72. Rugged capacitor structure 72 typically encompasses hemispherically grained (HSG) polysilicon material, or other suitably rugged or roughened polysilicon material, while the dielectric layer typically encompasses silicon nitride, or another suitable dielectric material. Generally, forming the dielectric layer of capacitor structure 72 is followed by an oxidation process that results in the formation of a thin oxide layer (not shown) to ensure the absence of any pinholes as might be present subsequent the initial formation of such dielectric layer, or otherwise prevent any undesired electrical conductance. Typically such an oxidation or other process resulting in the formation of a thin oxide layer, typically increases a thickness of such dielectric layer by no more than 1 to 3 nm. It will be noted that examples of such other suitable materials for the conductive layer and dielectric layer of capacitor structure 72, include rugged columnar polysilicon and silicon oxide, respectively.

The materials that encompass capacitor structure 72 are generally formed using CVD methods. Such CVD methods are not generally selective to forming within containers 70, therefore such materials are formed both within containers 70 as well as overlying second insulative layer 22. Hence, after forming such materials, a planarization process, again generally a CMP process as described above, is employed to form a planarized surface 23 and remove the overlying materials from such surface and define capacitor structure 72 within containers 70 as depicted. It will be noted that such a planarization process further defines second contact structures 62 and 64 as well as further reducing the initial thickness of layer 22. Thus BPSG layer 22, as was BPSG layer 20, is initially formed having a thickness that anticipates such a reduction of thickness by the planarization processes described above.

As second contact structures 62 and 64 extend through BPSG layers 20 and 22, and as containers 70 are formed in their entirety within BPSG layer 22, it should be readily understood that the forming of such structures using separate forming processes, by embodiments in accordance with the present invention, is advantageous. It will also be noted that such advantage extends to being able to design for a specific capacitance of the container capacitors being formed based primarily on a vertical dimension 74 of each container 70 (coincident to a final thickness of layer 22). Hence, more complex and therefore more difficult to fabricate container and capacitor structures, as have been previously known, are avoided simply by varying dimension 74 to obtain a desired capacitance. For example, for a first integrated circuit device requiring a first capacitance higher than a second capacitance of a second integrated circuit device, vertical dimension 74 for the first device will be greater than such a dimension 74 for the second device. Advantageously, it has been found that embodiments of the present invention allow for such vertical dimension 74 to be varied over a broad range of thicknesses. For example, in some embodiments in accordance with the present invention, a final thickness (dimension 74) of layer 22 has been varied between approximately 1500 nm to approximately 3000 nm. As previously noted, the initial thickness of layer 22 will be greater than this final thickness. It will be understood then, that any specific final thickness or dimension 74 for a device in accordance with the present invention is a design choice, depending in part from the capacitance desired. Finally, where reference is made to forming a structure in its entirety within a layer, it will be understood that such structure is formed within the upper and lower boundaries of the referred to layer, as well as any optional barrier layer as may be employed.

In FIG. 3, a cross-sectional view of another portion of an integrated circuit, displaced laterally from the view of FIG. 2 such that contact structures 54 of FIG. 2 are not depicted, is shown subsequent to additional processing in accordance with embodiments of the present invention. A conformal dielectric layer 76 is shown formed overlying the materials of capacitor structure 72 as well as upper surface 23 of layer 22. Such layer 76 is typically formed of a silicon nitride or a silicon oxide containing material, however, any other such material as might be selected to provide for an appropriate capacitance, once formation of the capacitor devices is completed, can be selected. Generally layer 76 is formed using an appropriate CVD process.

FIG. 3 also depicts third contact hole 80 exposing a portion of N-peripheral gate structure 32, and fourth contact holes 82 exposing portions of one memory contact structure 52 and N+ contact enhancement contact structure 56. In some embodiments in accordance with the present invention, prior to forming third and fourth contact holes 80 and 82, respectively, a masking layer (not shown) is disposed over dielectric layer 76 and such masking layer patterned to expose appropriate portions of layer 76. Such exposed portions of layer 76 as well as portions of underlying layers 22 and 20, are removed to forming contact holes 80 and 82, as depicted.

Contact hole 80 extends into first insulative layer 20 over gate structure 32. As previously discussed, gate structure 32 encompasses upper insulative layer 100 (FIG. 6). Therefore, the forming of contact hole 80 encompasses removing a portion of such insulative layer to expose an electrically conductive layer of gate structure 32, for example silicide layer 110 (FIG. 6). In contrast, contact holes 82 are depicted being positioned over first contact structures 52 and 56 and thus do not extend into first insulative layer 20. Advantageously, where contact holes 82 are formed by an etching process, such process etches the material of insulative layer 20 selectively with respect to the material of such contact structures. Thus contact structures 52 and 56 serve as essentially as an etch stop or barrier during the etching of contact hole 82 to allow for contact hole 80 to expose a portion of conductive layer 110 of gate structure 32.

Figure 4:
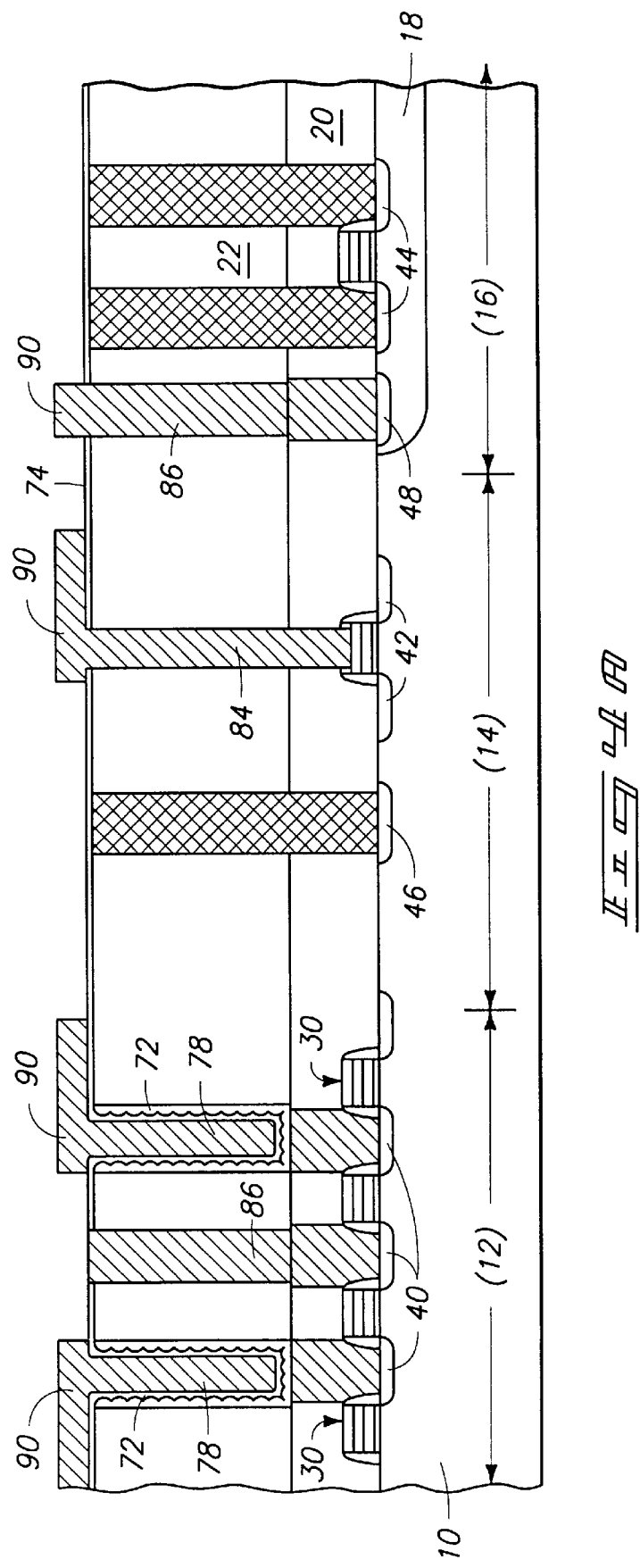
FIGS. 4A and 5A are a cross-sectional view of the portion of the integrated circuit of FIG. 3 at subsequent processing steps in accordance with embodiments of the present invention.
FIGS. 4B and 5B are a cross-sectional view of another portion of the integrated circuit of FIG. 3 at subsequent processing steps analogous to those of FIGS. 4A and 5A, in accordance with embodiments of the present invention.

Turning now to FIG. 4A, the structure depicted in FIG. 3 is shown after additional processing in accordance with embodiments of the present invention. The masking layer employed to define third and fourth contact holes 80 and 82, is removed and a conductive material (not shown) is deposited over layer 76 and within holes 80 and 82 as well as within containers 70 wherein such holes and containers are filled with the conductive material. Advantageously, such conductive material is generally an N-doped polysilicon material formed using a low pressure CVD process, such a process providing that the doped polysilicon material contacts the inwardly facing outer surface of the capacitor structure material and fills the space therebetween thus forming cell plates 78 therein. Such polysilicon material also advantageously forms contact plugs 84 and 86 within contact hole 80 and contact holes 82, respectively. Another masking layer (not shown) is formed overlying this conductive material and subsequently patterned to expose portions thereof. An etching process, generally a conventional plasma etching process, as is generally known, is employed to remove at least some of such exposed portions of the conductive material to complete defining contact plugs 84 and 86, and cell plates 78. As depicted, the etching process is also advantageously appropriate for defining local interconnects 90 overlying layer 76 as depicted.

In some embodiments of the present invention, the conductive material for forming contact plugs 84 and 86 as well as cell plates 78 is selected from a group of additional conductive materials other than materials encompassing polysilicon. Such additional materials include, but are not limited to platinum, titanium, tungsten, ruthenium, rhodium, iridium, titanium nitride, ruthenium oxide or iridium oxide, where the material selected is formed using an appropriate physical vapor deposition (PVD) or CVD method. In some embodiments such conductive material for forming conductive plugs 84 and 86, capacitor plates 78 and local interconnects 90 encompasses a first layer selected form the group of conductive materials and a second layer of another conductive material. In some embodiments having multiple conductive materials, one material is generally polysilicon material.

Turning now to FIG. 4B, a cross-sectional view of the another portion of the integrated circuit depicted in FIG. 3 is shown at the same processing step as discussed for FIG. 4A. While the structures depicted within memory portion 12 are essentially the same as shown in FIG. 4A, in P-peripheral region 16, contact structures 64 (FIG. 4A) to source/drain regions 44 are not seen and in N-peripheral region 14, contact structures 52/86 to source/drain regions 42 are seen. In addition, it will be noted that the several local interconnect regions 90 are changed between FIGS. 4A and 4B. It will be understood that such changed appearance is only a result of viewing different portions of the integrated circuit in cross-sectional view.

Figure 5A:
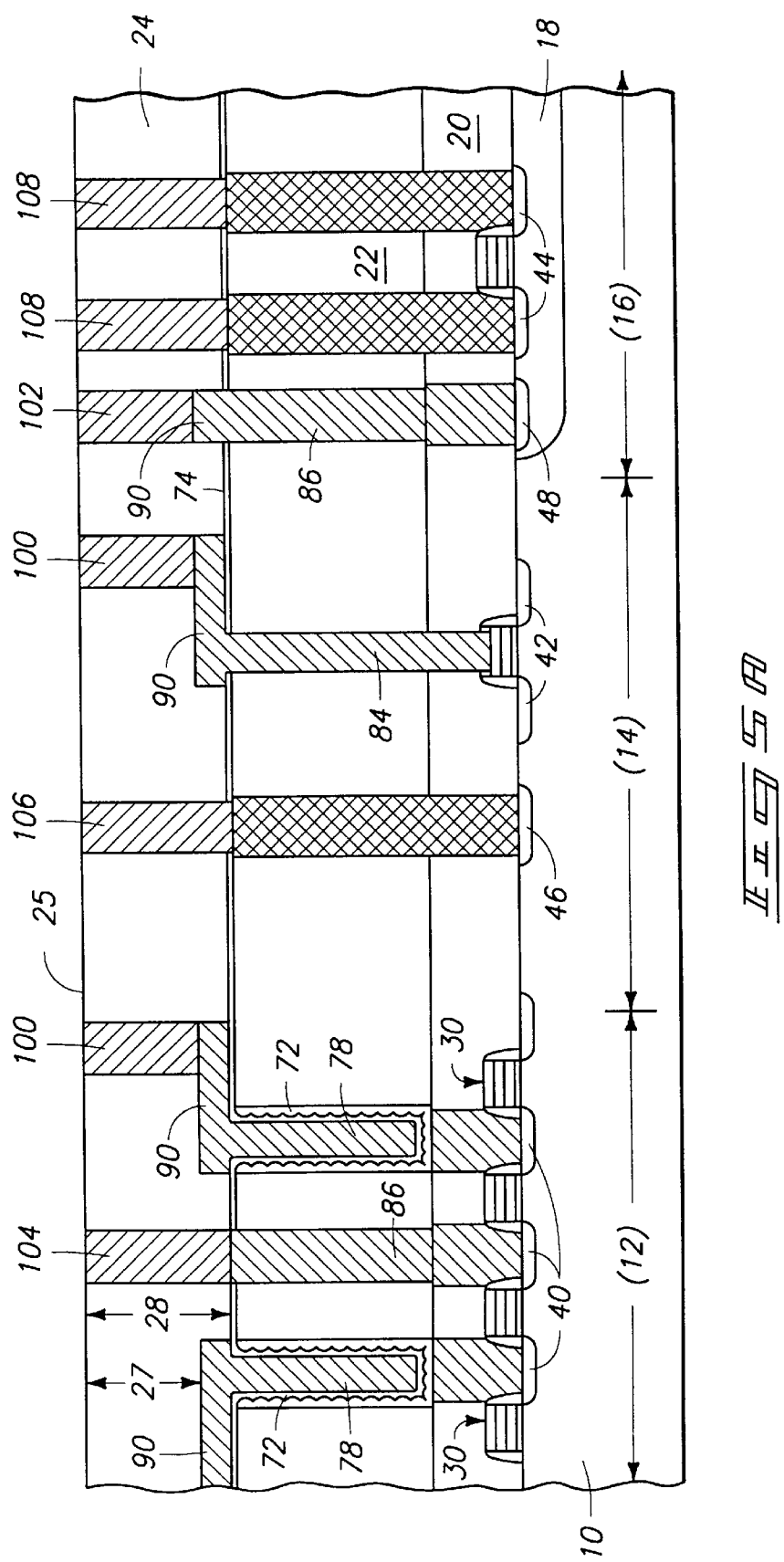

Turning now to FIG. 5A, the structure of FIG. 4A is seen at a subsequent processing step in accordance with embodiments of the present invention. A third insulative layer 24 is shown formed overlying conformal dielectric layer 76 and local interconnects 90. Third layer 24 is generally formed of BPSG, as discussed for layers 20 and 22, although it will be understood that other appropriate materials can also be used. A process, analogous to the forming of any of the previously formed contact structures is employed for forming contact structures 100, 102, 104, 106 and 108. Thus a masking layer (not shown) is disposed over third BPSG layer 24 and appropriately patterned to expose portions of an upper surface 25 and protect other portions of such surface during an etching process. It will be noted, that a contact hole (not shown) for each contact structure 104, 106 and 108 is formed to electrically contact an underlying contact structure 62, 64 or 77, respectively. Therefore each of such contact structure 104, 106 and 108 is formed by etching a contact hole entirely through thickness 28 of layer 24. In addition, it will be noted that each of contact structures 100 and 102 are formed to electrically contact an underlying local interconnects 90. Forming contact structures 100 and 102 does not require etching contact holes (not shown) through the entirety of thickness 28, rather only a thickness 27 is etched. Advantageously, the difference between thicknesses 28 and 27 is only the thickness of local interconnects 90. Thus where contact holes for all contacts 100–108 are etched concurrently, the etching time for the different contact holes is similar. Advantageously, as the thickness 28 is increased, the difference between thicknesses 28 and 27 remains constant, and the significance of this difference reduced. Thus in comparison to previously known methods, embodiments in accordance with the present invention provide for the thickness 28 of layer 24 to be increased significantly and take advantage of benefits from such an increased thickness as discussed below.

Once the contact holes of contact structures 100–108 are formed, such openings are filled with a conductive material. In some embodiments in accordance with the present invention, the conductive material is tungsten, where a thin layer of a barrier material such as titanium nitride is first deposited and a blanket layer of tungsten second deposited. In this manner the contact openings are uniformly filled. A subsequent planarization process is then employed to remove the tungsten from over surface 24 and complete the definition of each contact structure 100–108. It will be understood that other methods and materials for filling such contact openings to complete the formation of structures 100–108 are possible and are encompassed by other embodiments in accordance with the present invention.

Figure 5B:
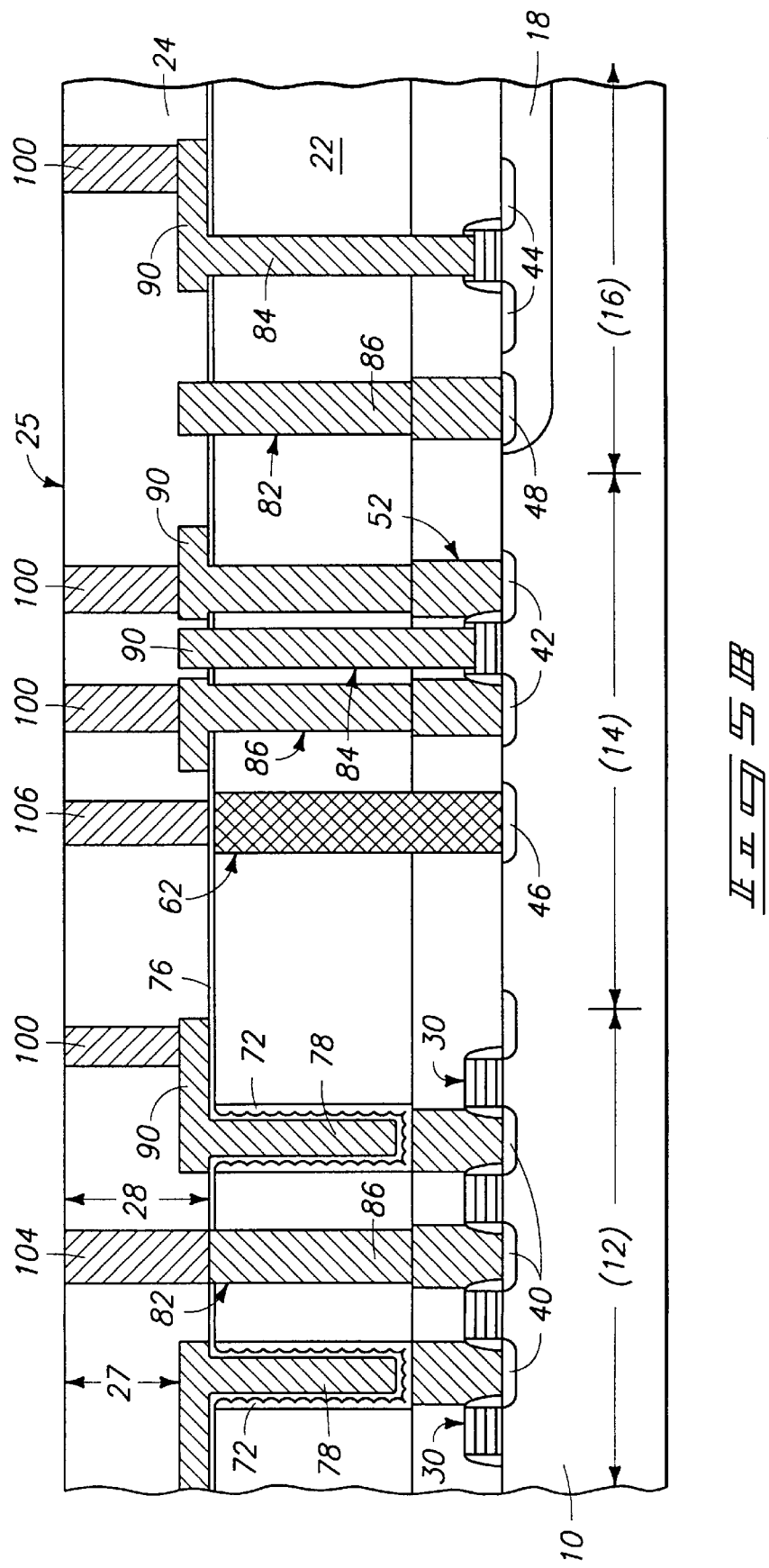

Turning now to FIG. 5B, a cross-sectional view of the another portion of the integrated circuit depicted in FIG. 3 is shown at the same processing step as discussed for FIG. 5A. As seen in comparing FIGS. 4A and 4B, the differences between structures depicted between FIGS. 5A and 5B are essentially the same. As before, it will be understood that such changed appearance is only a result of viewing different portions of the integrated circuit in cross-sectional view.

Previously known methods for forming contact structures to a word line (analogous to contact 104), or an N-well contact (analogous to contact 106) generally require simultaneously etching such contacts to significantly different vertical levels making such previously known methods difficult to control and often unreliable. In addition, in forming the structures for etching by the previously known methods, typically the thickness of the uppermost insulative layer (analogous to layer 24) is minimized to keep differences in the vertical levels, for example the difference in vertical levels for forming contact structures 104 and 106, to a minimum. Advantageously, embodiments in accordance with the present invention are not so restricted. Thus some embodiments of the present invention have an uppermost insulative layer (layer 24 in FIG. 5A) that has an increased thickness as compared to such layers than are previously known, for example, a thickness of at least approximately 1000 nm. In this manner, such embodiments advantageously reduce capacitive coupling between levels of conductive layers.

By now it will be appreciated that embodiments in accordance with the present invention provide for forming contact structures in a manner that essentially separates such forming steps from the forming steps of a capacitor structure. In this manner, varying the vertical dimension of that capacitor structure, at least in part by varying the thickness of a second insulative layer, is readily used to vary the structure's capacitance. It will be further appreciated, that as embodiments of the present invention generally form contact structures that are layer specific, that is structures that are generally contained within a specific insulative layer, the forming of such contact structures is simplified with respect to previously known methods. In addition, embodiments in accordance with the present invention form a contact structure to the N-well separately from other types of contacts or other types of structures, enhancing and simplifying contact structure formation. It will also be appreciated that as embodiments of the present invention provide contacting means proximate the upper surface of the insulative layer having the container capacitor structure formed therein, an overlying insulative layer can be formed having a thickness greater than previously known. In this manner, capacitive coupling between proximate layers of conductive material is reduced.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for forming contact structures and container structures, comprising:
   providing a semiconductor substrate comprising a first insulative layer formed over the substrate, a second insulative layer formed over the first insulative layer, the first insulative layer having a plurality of first contact structures formed therein, the first contact structures having a first conductivity type;
   forming a third insulative layer over the second insulative layer;
   prior to forming the third insulative layer, separately forming a second contact structure within the second insulative layer and the first insulative layer, the second contact structure having a second conductivity type, different than the first conductivity type; and
   prior to forming the third insulative layer, separately forming a container structure overlying one of the plurality of first contact structures, the container structure electrically contacting the first contact structure.

2. The method of claim 1, wherein providing the semiconductor substrate comprises providing the substrate having a memory array region, an N-peripheral region and a P-peripheral region.

3. The method of claim 2, wherein the plurality of first contact structures comprise memory array contact structures for electrically contacting portions of the memory array region and a P-peripheral contact structure for electrically contacting a portion of the P-peripheral region.

4. The method of claim 3, wherein forming the container structure comprises forming the container structure overlying and electrically contacting one of the memory array contact structures.

5. The method of claim 2, wherein forming the second contact structure comprises forming a contact structure electrically contacting a portion of the N-peripheral region.

6. The method of claim 1, wherein the first contact structures comprise N-type polysilicon and the second contact structure comprises P-type polysilicon.

7. The method of claim 1 wherein the first insulative layer comprises a borophosphosilicate glass (BPSG) material of a first thickness and the second insulative layer comprises a BPSG material of a second thickness, the second thickness being at least twice the first thickness.

8. The method of claim 7 further comprising forming a layer disposed between the first insulative layer and the second insulative layer, such layer comprising a material selectively etchable with respect to the second insulative layer.

9. The method of claim 1 further comprising forming a layer of capacitor structure material within each container, the capacitor structure material having inwardly facing outer surfaces and a space therebetween.

10. The method of claim 9 wherein forming the layer of capacitor structure material comprises forming a layer of hemispherical grained (HSG) polysilicon and a layer of dielectric material overlying the HSG layer, the dielectric layer having the inwardly facing outer surfaces.

11. The method of claim 10 wherein forming the layer of dielectric material comprises forming a layer of material comprising silicon nitride.

12. The method of claim 9, further comprising forming a plurality of third contact structures within the second insulative layer, each third contact structure electrically contacting one first contact structure not contacting a container structure.

13. The method of claim 12, further comprising forming a fourth contact structure within the second insulative layer and a portion of the first insulative layer, the fourth contact structure electrically contacting an N-peripheral region gate structure.

14. The method of claim 13, wherein the fourth contact structure is formed essentially simultaneously with the forming of the plurality of third contact structures.

15. The method of claim 9, further comprising forming a capacitor plate material, such material contacting the inwardly facing outer surface of the capacitor structure material and filling the space therebetween.

16. The method of claim 15, wherein the capacitor plate material comprises a polysilicon material.

17. The method of claim 15 wherein the capacitor plate material comprises a material selected from the group of materials consisting of a polysilicon material, platinum, ruthenium, rhodium, iridium, ruthenium oxide and iridium oxide.

18. The method of claim 15 wherein the capacitor plate material further comprises a polysilicon material.

19. The method of claim 18 further comprising:
   forming a layer of capacitor plate material over an upper surface of the second insulative layer; and
   patterning the layer of capacitor plate material to form local interconnect structures.

20. The method of claim 18 further comprising forming a third insulative layer over the second insulative layer and local interconnects.

21. The method of claim 20 further comprising simultaneously forming a plurality of contact structures disposed, in their entirety, within the third insulative layer, each of such contact structures electrically contacting an underlying contact structure or local interconnect.

22. The method of claim 21, wherein forming the plurality of contact structures disposed, in their entirety, within the third insulative layer, comprises depositing a layer of tungsten comprising material to fill at least a portion of such contact structures.

23. A method of forming an integrated circuit comprising:
   providing a semiconductor substrate comprising a memory array region, an N-peripheral region and a P-peripheral region, a first insulative layer, having a first thickness, formed over such regions, said first insulative layer having a plurality of first contact structures formed therein, each first contact structure overlying either the memory array region or the P-peripheral region, the first contact structures comprising a conductive material of a first conductivity type;
   forming a second insulative layer having a second thickness greater than the first thickness;
   etching to form second opening through the second insulative layer and the first insulative layer, the second opening exposing a portion of the N-peripheral region; and
   filling the second opening with a conductive material of a second conductivity type, opposite the first type.

24. The method of claim 23, wherein the second thickness is at least twice the first thickness.

25. The method of claim 23, further comprising etching to form a plurality of container structures within the second insulative layer, the etching separate from the etching to form the second opening.

26. The method of claim 25 further comprising:
   etching to form a plurality of third openings within the second insulative layer; and prior to etching to form the plurality of third openings, forming capacitor structure material disposed within the container structure, the capacitor structure material having outwardly facing inner surfaces with a space formed therebetween; and forming capacitor plate material wherein the capacitor plate material is disposed to essentially simultaneously fill each of the plurality of third openings and each of the plurality of containers, such forming of capacitor plate material forming a container capacitor and a local interconnects over the second insulative layer.

27. The method of claim 26, wherein forming capacitor plate material comprises forming a material selected from a group of materials consisting of a doped polysilicon material, platinum, ruthenium, rhodium, iridium, ruthenium oxide and iridium oxide.

28. The method of claim 26, further comprising patterning the layer of capacitor plate material to define a plurality of local interconnect structures, each interconnect structure contiguous with a filled contact hole and/or a filled capacitor container.

29. The method of claim 28 further comprising calculating the second thickness based on a desired capacitance of the container capacitor.

30. The method of claim 26, further comprising forming a third insulative layer disposed overlying the second insulative layer and plurality of local interconnects, the third insulative layer having a thickness of at least about 1000 nm.

31. The method of claim 30, further comprising forming a plurality of contact structures, each contact structure formed in its entirety within the third insulative layer.

* * * * *

UNITED STATES PATENT AND TRADEMARK OFFICE
CERTIFICATE OF CORRECTION

PATENT NO. : 6,383,868 B1
DATED : May 7, 2002
INVENTOR(S) : Kunal R. Parekh et al.

It is certified that error appears in the above-identified patent and that said Letters Patent is hereby corrected as shown below:

Column 5,
Line 32, replace "CVD process employing SiH4, N2O, B2H6" with -- CVD process employing $SiH_4$, $N_2O$, $B_2H_6$ --
Line 33, replace "and PH3 is appropriate." with -- and $PH_3$ is appropriate. --
Line 46, replace "such an etch stop layer include BN, Si3N4," with -- such an etch stop layer include BN, $Si_3N_4$, --

Column 9,
Line 7, replace "encompasses a first layer selected form the group" with -- encompasses a first layer selected from the group --

Signed and Sealed this

Eleventh Day of February, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,383,868 B1  Page 1 of 1
APPLICATION NO. : 09/653501
DATED : May 7, 2002
INVENTOR(S) : Kunal R. Parekh et al.

It is certified that error appears in the above-identified patent and that said Letters Patent is hereby corrected as shown below:

Col. 4, line 60 - Replace "diffusion from BPSG layer into substrate 10,"
With --diffusion from BPSG layer 20 into substrate 10,--

Signed and Sealed this

Sixth Day of March, 2007

JON W. DUDAS
*Director of the United States Patent and Trademark Office*